United States Patent
Kang et al.

(10) Patent No.: US 9,542,882 B2
(45) Date of Patent: Jan. 10, 2017

(54) ORGANIC LIGHT EMITTING DIODE DISPLAY

(75) Inventors: Ki-Nyeng Kang, Yongin (KR); Na-Young Kim, Yongin (KR); Wang-Jo Lee, Yongin (KR); In-Ho Choi, Yongin (KR); Yong-Sung Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 909 days.

(21) Appl. No.: 13/305,816

(22) Filed: Nov. 29, 2011

(65) Prior Publication Data

US 2012/0176299 A1 Jul. 12, 2012

(30) Foreign Application Priority Data

Jan. 10, 2011 (KR) .................. 10-2011-0002382

(51) Int. Cl.
*G09G 3/32* (2016.01)
*H01L 27/32* (2006.01)

(52) U.S. Cl.
CPC ......... *G09G 3/3225* (2013.01); *H01L 27/3276* (2013.01); *H01L 27/3279* (2013.01)

(58) Field of Classification Search
CPC ...................................................... G06F 3/038
USPC ........................................................ 345/82
See application file for complete search history.

(56) References Cited

U.S. PATENT DOCUMENTS

| 8,847,932 B2* | 9/2014 | Kang .................. G09G 3/3208 345/204 |
| 2005/0190175 A1* | 9/2005 | Kim .................... G02F 1/13452 345/204 |
| 2008/0007159 A1* | 1/2008 | Seo ........................ H01L 51/529 313/504 |
| 2011/0234565 A1* | 9/2011 | Morii et al. .................. 345/211 |

FOREIGN PATENT DOCUMENTS

| KR | 10-1999-0009397 | * | 9/1997 |
| KR | 1998-045325 A | | 9/1998 |
| KR | 1999-009397 A | | 2/1999 |
| KR | 10-2010-0011900 A | | 2/2010 |

* cited by examiner

*Primary Examiner* — Claire X Pappas
*Assistant Examiner* — Sepideh Ghafari
(74) *Attorney, Agent, or Firm* — Robert E. Bushnell, Esq.

(57) ABSTRACT

An organic light emitting diode display includes: a panel; a data driver connected to a data line formed on the panel; a gate driver crossing the data line in an insulated manner and connected to gate lines formed on the panel; an input line for receiving clock signals from the outside; a first connecting line electrically connected to the input line to supply the clock signal to the gate driver; a second connecting line electrically connected to the input line; and a third connecting line extended from the second connecting line to electrically connect the second connecting line and the first connecting line.

6 Claims, 5 Drawing Sheets

ORGANIC LIGHT EMITTING DIODE DISPLAY

CLAIM OF PRIORITY

This application makes reference to, incorporates the same herein, and claims all benefits accruing under 35 U.S.C. §119 from an application earlier filed in the Korean Intellectual Property Office on 10 Jan. 2011 and there duly assigned Serial No. 10-2011-0002382.

BACKGROUND OF THE INVENTION

Field of the Invention

The described technology relates generally to an organic light emitting diode (OLED) display. More particularly, the described technology relates generally to an organic light emitting diode (OLED) display including a gate driver.

Description of the Related Art

Display devices display images, and the organic light emitting diode display among them has been in the spotlight.

The OLED display has a self luminance characteristic and does not require a separate light source, unlike a liquid crystal display (LCD) device, and thus can have reduced thickness and weight. Further, the OLED display represents high quality characteristics of low power consumption, high luminance, and a high reaction speed.

FIG. 1 shows a conventional organic light emitting diode (OLED) display.

As shown in FIG. 1, the conventional organic light emitting diode (OLED) display includes a panel 1, a data driver 3, a gate driver 4, and a pixel (PE).

The pixel (PE) is formed at a crossing region of gate lines (S1 to Sn) and data lines (D1 to Dm). Although not shown, drive power lines can be formed to face the data lines (D1 to Dm). The pixel (PE) is selected to charge a voltage corresponding to a data signal when a gate signal is provided, and it emits light with predetermined luminance in correspondence with the charged voltage.

The data driver 3 supplies a data signal to the data lines (D1 to Dm) when a gate signal is provided from the gate driver 4.

The gate driver 4 sequentially supplies a gate signal to the gate lines (S1 to Sn). Here, the gate driver 4 is formed to be installed on the panel 1 when the pixel (PE) is formed. For this purpose, the gate driver 4 includes an input line 5 and a connecting line 6 provided between an input line 5 and the gate driver 4.

The input line 5 receives a clock signal from a flexible printed circuit (FPC) (not shown). The connecting line 6 is electrically connected to the input line 5, is formed in parallel with the data lines (D1 to Dm), and supplies the clock signal to a stage (not shown) included in the gate driver 4.

Here, the connecting line 6 formed on the panel 1 is provided to be overlapped on the cathode 2. When the cathode 2 is overlapped on the connecting line 6, the connecting line 6 and the cathode 2 form a capacitor to delay the clock signal. In order to overcome such a problem, a plurality of flexible printed circuits (FPCs) 7 are conventionally installed with predetermined intervals so as to be connected to the panel 1, and the clock signal is additionally provided to the connecting line 6 by using the FPCs, which however increases the production cost and thus deteriorates the production yield.

The above information disclosed in this Background section is only for enhancement of understanding of the background of the described technology and therefore it may contain information that does not form the prior art that is already known in this country to a person of ordinary skill in the art.

SUMMARY OF THE INVENTION

The described technology has been made in an effort to provide an organic light emitting diode (OLED) display for minimizing delay of clock signals, reducing production cost, and improving production yield.

An exemplary embodiment provides an organic light emitting diode display including: a panel; a data driver connected to a data line formed on the panel; a gate driver crossing the data line in an insulated manner and connected to gate lines formed on the panel; an input line for receiving clock signals from an outside; a first connecting line electrically connected to the input line to supply the clock signal to the gate driver; a second connecting line electrically connected to the input line; and a third connecting line extended from the second connecting line to electrically connect the second connecting line and the first connecting line.

The organic light emitting diode display further includes: a first electrode provided on the first substrate; an organic emission layer provided on the first electrode; and a second electrode provided on the organic emission layer, and the first connecting line is overlapped on the second electrode.

The second connecting line is not overlapped on the second electrode.

The gate line is formed with a gate transparent layer and a gate metal layer formed on the gate transparent layer, and the first electrode is formed on the same layer and with the same material as the gate transparent layer.

The first connecting line is formed on the same layer and with the same material as the data line.

The second connecting line is formed on the same layer and with the same material as the gate line.

The third connecting line is formed on the same layer and with the same material as the second connecting line.

The data line is provided on the gate line, and includes: a first insulation layer provided between the gate line and the data line; and a second insulation layer provided on the data line and including an organic material, and the second connecting line is not overlapped on the second insulation layer.

According to the embodiment, an organic light emitting diode (OLED) display for minimizing clock signal delay, reducing production cost, and improving production yield is provided.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
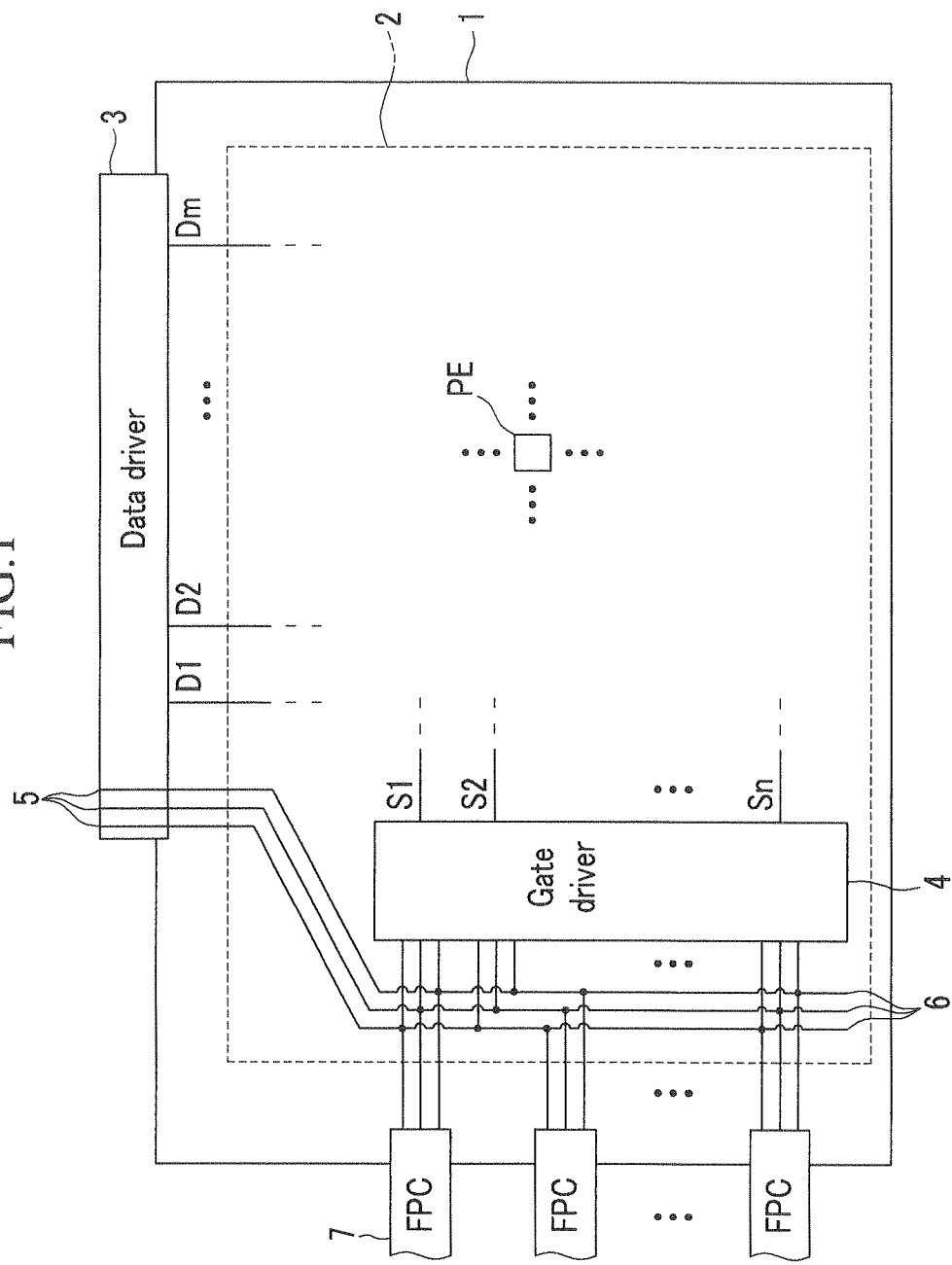
FIG. 1 shows a conventional organic light emitting diode (OLED) display.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each component shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thicknesses of some layers and areas are exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. In addition, "~on" is either positioned on or below a portion of a target or positioned on the upper side based on a gravity direction, throughout the specification.

An organic light emitting diode (OLED) display according to an exemplary embodiment will now be described with reference to FIG. 2 to FIG. 5.

Figure 2:
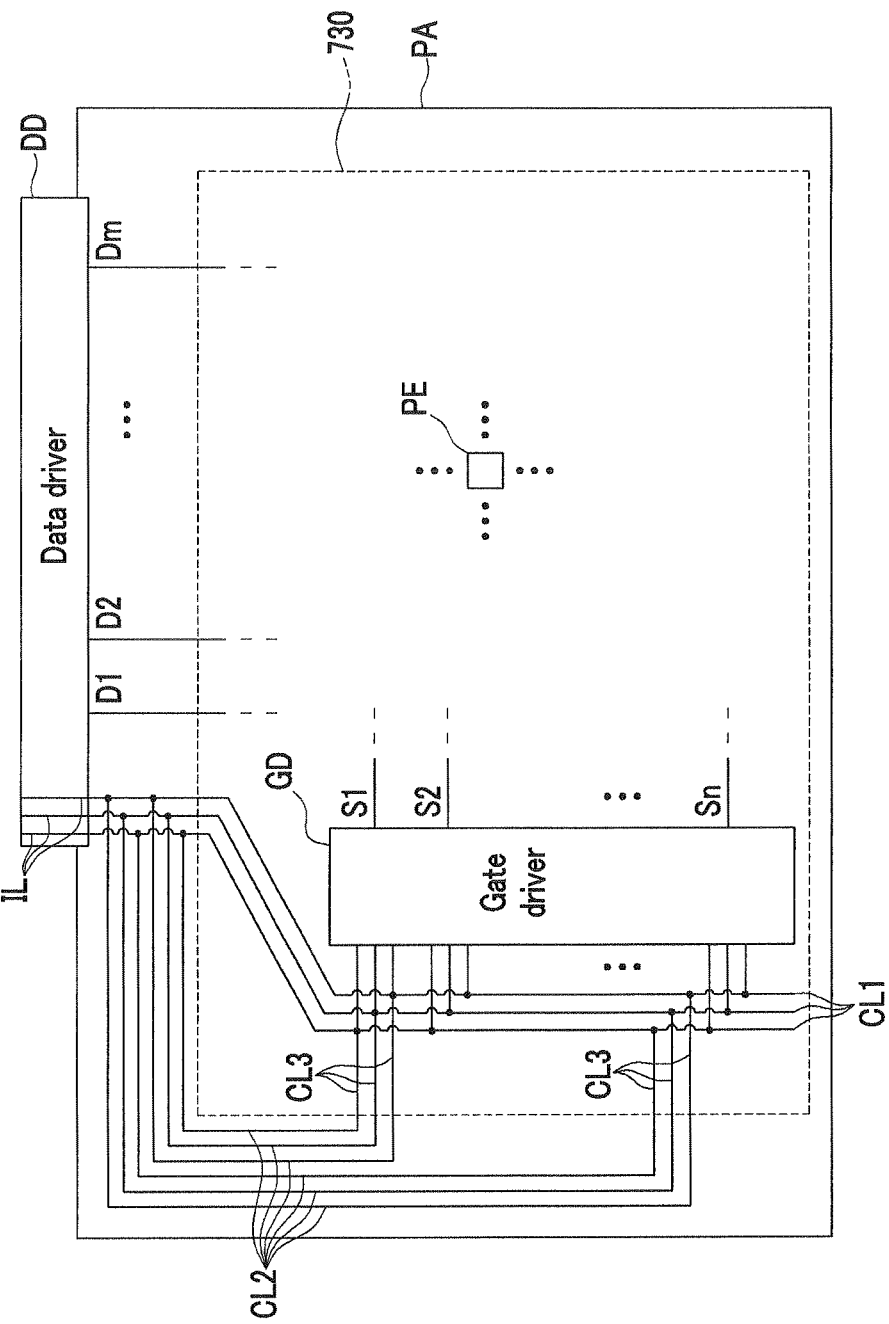
FIG. 2 shows an organic light emitting diode (OLED) display according to an exemplary embodiment.

FIG. 2 shows an organic light emitting diode (OLED) display according to an exemplary embodiment.

As shown in FIG. 2, the organic light emitting diode (OLED) display includes a panel (PA), a data driver (DD), a gate driver (GD), and a pixel (PE). Here, the pixel (PE) represents the minimum unit for displaying the image, and the organic light emitting diode (OLED) display displays the images through a plurality of pixels (PEs).

The pixel (PE) is formed at a crossing region of the gate lines (S1 to Sn) and the data lines (D1 to Dm). Although not shown in FIG. 2, a drive power line can be formed to face the data lines (D1 to Dm). The pixel (PE) is selected to charge the voltage corresponding to the data signal when the gate signal is supplied, and it emits light with predetermined luminance in corresponding to the charged voltage. A detailed disposal of the pixel (PE) will be described later.

The data driver (DD) supplies the data signal to the data lines (D1 to Dm) when the gate signal is provided by the gate driver (GD). Here, the data driver (DD) is configured with a plurality of data integrated circuits (not shown). The data integrated circuits respectively include j (j is a natural number) channels so as to supply j data signals.

The gate driver (GD) sequentially supplies the gate signal to the gate lines (S1 to Sn). Here, the gate driver (GD) can be installed on the panel (PA) when the pixel (PE) is formed. The gate driver (GD) installed on the panel (PA) receives the clock signal from an outer device. For this purpose, an input line IL, a first connecting line CL1, a second connecting line CL2, and a third connecting line CL3 are formed on the panel (PA).

The input line IL receives the clock signal from a flexible printed circuit (FPC) (not shown) through a channel of the data integrated circuit included in the data driver (DD). In detail, some channels from among the data integrated circuits configured with j channel are not used. The input line IL receives the clock signal from the flexible printed circuit (FPC) through the unused channels.

The first connecting line CL1 is formed in parallel with the gate driver (GD), and is electrically connected to the input line IL. The first connecting line CL1 supplies the clock signal provided by the input line (IL) to the gate driver (GD). In detail, the gate driver (GD) includes n stages respectively connected to the gate lines (S1 to Sn). The first connecting line CL1 supplies the clock signal to the stages so that the gate signal may be generated in the stage.

The first connecting line CL1 is electrically connected to the stage forming the gate driver (GD) so it is formed near the gate driver (GD). In this case, the first connecting line CL1 provided near the gate driver (GD) is overlapped on a second electrode 730, which is a cathode to be described later.

The second connecting line CL2 is formed in parallel with the gate driver (GD), and is electrically connected to the input line (IL). The second connecting line CL2 is electrically connected to the first connecting line CL1 through the third connecting line CL3 which is extended from the second connecting line CL2, and electrically connecting the second connecting line CL2 and the first connecting line CL1. That is, the second connecting line CL2 and the third connecting line CL3 are integrally formed. The third connecting line CL3 can electrically connect the second connecting line CL2 for receiving a specific clock signal and the first connecting line CL1 for receiving the specific clock signal at a plurality of nodes. The nodes between the first connecting line CL1 and the second connecting line CL2 are increased by increasing the number of the second connecting lines CL2 and the third connecting lines CL3 corresponding to the number of nodes to be increased. When the second connecting line CL2 and the first connecting line CL1 receiving the same clock signal are electrically connected, resistance of the first connecting line CL1 is reduced to minimize the delay of the clock signal.

Particularly, the second connecting line CL2 is not overlapped on the second electrode 730, which is a cathode. In this case, the second connecting line CL2 does not form a capacitor with the second electrode 730, so the clock signal is not delayed. Therefore, the first connecting line CL1 for receiving the clock signal at a plurality of nodes through the second connecting line CL2 minimizes the delay of the clock signal.

A detailed stacked state of the first connecting line CL1, the second connecting line CL2, and the third connecting line CL3 will be described later.

Figure 3:
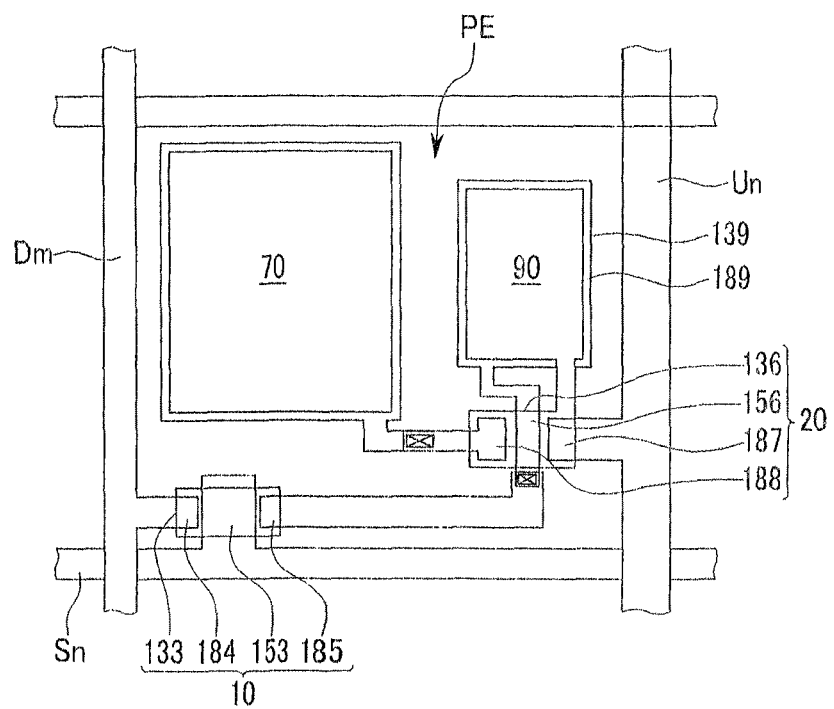
FIG. 3 shows a layout view of a pixel of an organic light emitting diode (OLED) display shown in FIG. 2.

Referring to FIG. 3, a disposal of a pixel (PE) will be described in detail.

FIG. 3 shows a layout view of a pixel of an organic light emitting diode (OLED) display shown in FIG. 2.

As shown in FIG. 3, the pixel (PE) includes an organic light emitting diode 70, a plurality of thin film transistors (TFTs) 10 and 20, and a capacitor 90 in the two-transistors-one-capacitor (2Tr-1Cap) structured organic light emitting diode (OLED) display. However, the exemplary embodiment is not limited thereto. Therefore, the display device can be an organic light emitting diode (OLED) display including at least three thin film transistors and at least two capacitors for each pixel (PE). Also, the display device can be formed to have various configurations with an additional wire formed. Accordingly, at least one of the additionally formed thin film transistor and capacitor can be an element of a compensation circuit. The compensation circuit improves uniformity of the organic light emitting element 70 formed for each pixel (PE) to control generation of deviation of image quality. In general, the compensation circuit can include 2 to 8 thin film transistors.

The organic light emitting element 70 includes a first electrode, an anode functioning as a hole injection electrode, a second electrode, a cathode functioning as an electron injection electrode, an organic emission layer disposed between the first electrode and the second electrode.

In detail, the organic light emitting diode (OLED) display includes a first thin film transistor 10 and a second thin film transistor 20 formed for each pixel (PE). The first thin film transistor 10 and the second thin film transistor 20 include gate electrodes 153 and 156, semiconductor layers 133 and 136, source electrodes 184 and 187, and drain electrodes 185 and 188 respectively.

Also, a gate line (Sn), a data line (Dm), and a common power line (Un) are formed on the panel (PA). The pixel (PE) is defined by the gate line (Sn), the data line (Dm), and the common power line (Un). However, the pixel (PE) is not limited thereto. Further, a capacitor line can be additionally formed on the panel (PA).

The data line Dm is connected to the source electrode 184 of the first thin film transistor 10, and the gate line (Sn) is connected to the gate electrode 153 of the first thin film transistor 10. A node is formed between the drain electrode 185 of the first thin film transistor 10 and the capacitor 90 and the drain electrode 185 of the first thin film transistor 10 is connected to a first capacitor electrode 139 of the capacitor 90. Further, the drain electrode 185 of the first thin film transistor 10 is connected to the gate electrode 156 of the second thin film transistor 20. The source electrode 187 of the second thin film transistor 20 is connected to the common power line (Un), and the drain electrode 188 is connected to the first electrode, the anode of the organic light emitting element 70.

The first thin film transistor 10 is used as a switch for selecting a pixel (PE) to emit light. When the first thin film transistor 10 is turned on, the capacitor 90 is charged in proportion to the voltage applied from the data line Dm. While the first thin film transistor 10 is turned off, a gate potential of the second thin film transistor 20 increases according to the potential charged in the capacitor 90. The second thin film transistor 20 is turned on when the gate potential exceeds a threshold voltage. The voltage applied to the common power line (Un) is applied to the organic light emitting element 70 through the second thin film transistor 20, and the organic light emitting element 70 emits light.

The above-noted configuration of the pixel (PE) is not restricted to the description and is variable in many ways within a range easily modifiable by a person skilled in the art.

Figure 4:
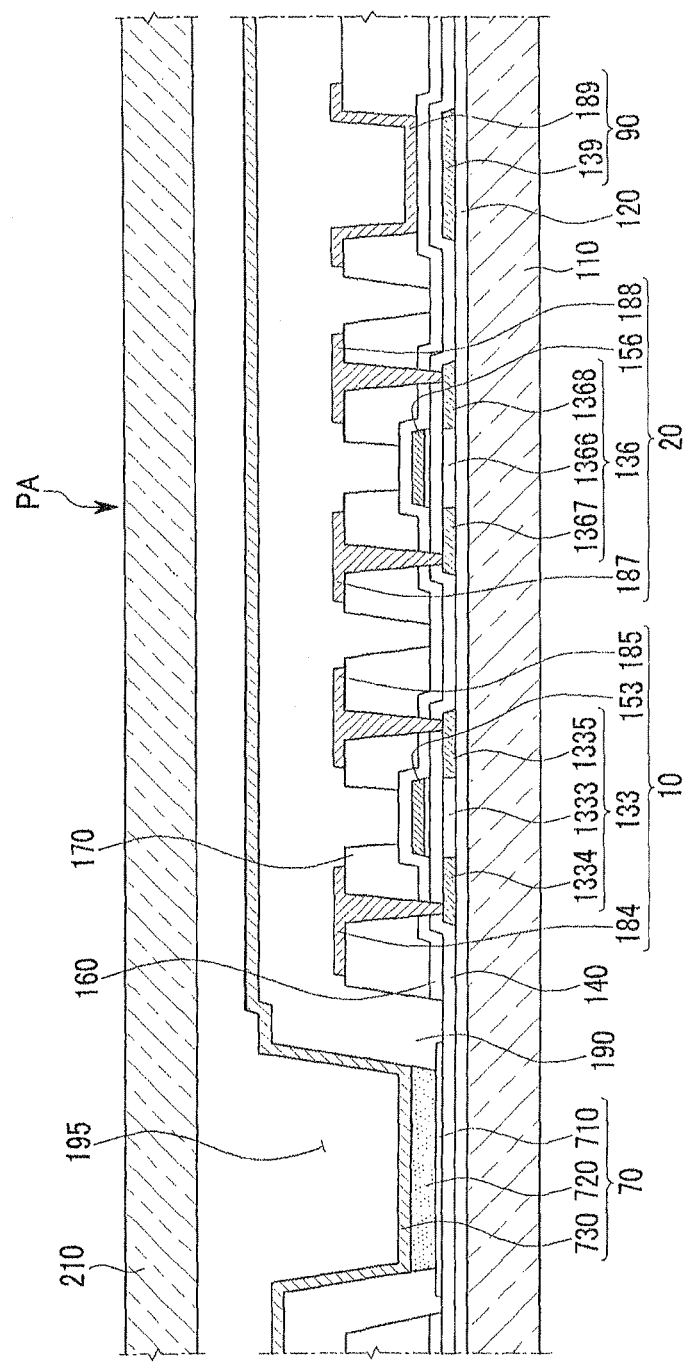
FIG. 4 shows a partially magnified cross-sectional view with respect to a thin film transistor, a capacitor, and an organic light emitting element shown in FIG. 3.

Referring to FIG. 4, a configuration of thin film transistors 10 and 20, an organic light emitting element 70, and a capacitor 90 according to an exemplary embodiment will be described in detail in the stacked sequence.

FIG. 4 shows a partially magnified cross-sectional view with respect to a thin film transistor, a capacitor, and an organic light emitting element shown in FIG. 3.

The panel (PA) includes a first substrate 110 and a second substrate 210 facing each other. At least one of the first substrate 110 and the second substrate 210 is formed as a transparent insulating substrate made of glass, quartz, ceramic, or plastic. However, the exemplary embodiment is not restricted thereto, and the first substrate 110 and the second substrate 210 can be formed with a metallic substrate made of stainless steel. Also, when the first substrate 110 and the second substrate 210 are made of plastic, the panel (PA) can be formed to be flexible.

A buffer layer 120 is formed on the first substrate 110. The buffer layer 110 is formed with a single layer or a multi-layer including at least one of insulating layers such as a silicon oxide layer or a silicon nitride layer using a chemical vapor deposition method or a physical vapor deposition method.

The buffer layer 120 prevents diffusion or penetration of moisture or impurities generated from the substrate 110, smoothes the surface, and controls the transmission speed of heat during a crystallization process for forming a semiconductor layer.

The buffer layer 120 can be omitted depending on types of the first substrate 110 and process conditions.

Semiconductor layers 133 and 136 and a first capacitor electrode 139 are formed on the buffer layer 120. The semiconductor layers 133 and 136 and the first capacitor electrode 139 are formed by forming an amorphous silicon layer on the buffer layer 120, crystallizing it to form a polysilicon layer, and patterning the same. However, the exemplary embodiment is not limited thereto. Depending on the cases, the first capacitor electrode 139 can be formed with a material that is different from that of the semiconductor layers 133 and 136.

A gate insulating layer 140 is formed on the semiconductor layers 133 and 136 and the first capacitor electrode 139. In detail, the gate insulating layer 140 is formed to cover the semiconductors layer 133 and 136 and the first capacitor electrode 139 on the buffer layer 120. The gate insulating layer 140 can be formed to include at least one of various insulating materials known to a skilled person such as tetra ethyl ortho silicate (TEOS), silicon nitride (SiNx), and silicon oxide ($SiO_2$).

Gate electrodes 153 and 156 and a first electrode 710 formed on the same layer and with the same material as the gate lines (S1 to Sn) are formed on the gate insulating layer 140. The gate electrodes 153 and 156 are formed on the semiconductor layers 133 and 136 to be overlapped on channel regions 1333 and 1366 of the semiconductor layers 133 and 136. The semiconductor layers 133 and 136 are classified as impurity-non-doped channel regions 1333 and 1366, and source regions 1334 and 1367 and drain regions 1335 and 1368 that are disposed on both sides of the channel regions 1333 and 1366 and that are doped with an impurity. The gate electrodes 153 and 156 prevent the channel regions 1333 and 1366 from being doped with an impurity when the source regions 1334 and 1367 and the drain regions 1335 and 1368 are doped with an impurity. Also, an impurity can be doped to the first capacitor electrode 139 when the impurity is doped to the source regions 1334 and 1367 and the drain regions 1335 and 1368 of the semiconductor layers 133 and 136.

Also, the gate electrodes 153 and 156 are formed with a gate transparent layer and a gate metal layer formed on the gate transparent layer. The gate metal layer is formed to include at least one of the various metallic materials known to a skilled person such as molybdenum (Mo), chromium (Cr), aluminum (Al), silver (Ag), titanium (Ti), tantalum (Ta), and tungsten (W). The gate transparent layer includes at least one of the transparent conductive layers including indium tin oxide (ITO), indium zinc oxide (IZO), zinc indium tin oxide (ZITO), gallium indium tin oxide (GITO), indium oxide ($In_2O_3$), zinc oxide (ZnO), gallium indium zinc oxide (GIZO), gallium zinc oxide (GZO), fluorine tin oxide (FTO), and aluminum-doped zinc oxide (AZO).

The first electrode 710 is formed on the same layer and with the same material as the gate transparent layer of the gate electrodes 153 and 156.

An inorganic insulation layer 160 is formed on the gate electrodes 153 and 156. The inorganic insulation layer 160 includes at least one of the silicon nitride layer and the silicon oxide layer. That is, the inorganic insulation layer 160 is a single layer formed with the silicon nitride layer or the silicon oxide layer, or a double layer stacked with the silicon nitride layer and the silicon oxide layer. Also, the inorganic insulation layer 160 can include hydrogen. Particularly, the silicon nitride layer can easily include hydrogen according to the process condition. The inorganic insulation layer 160 can support a process for annealing the semiconductor layers 133 and 136 by providing hydrogen to the semiconductor layers 133 and 136 in addition to having the insulation function.

However, the exemplary embodiment is not limited thereto. Therefore, the inorganic insulation layer 160 can be omitted. That is, the first insulation layer 170 to be described can be formed on the gate electrodes 153 and 156.

Further, the inorganic insulation layer 160 is not formed on the first electrode 710. That is, the inorganic insulation layer 160 is formed to expose the first electrode 710.

A first insulation layer 170 is formed on the inorganic insulation layer 160. It is easy to form the first insulation layer 170 to be relatively thicker than the inorganic insulation layer 160. Hence, the first insulation layer 170 can be formed to have a substantial thickness so as to acquire stable inter-layer insulation. For example, the first insulation layer 170 can be formed to have a thickness of 3 μm (micrometer).

Also, the first insulation layer 170 is not formed on the first electrode 710 in a like manner of the inorganic insulation layer 160. That is, the first insulation layer 170 is formed to reveal the first electrode 710.

A plurality of conductive wires 184, 185, 187, 188, and 189 are formed on the first insulation layer 170 on the same layer and with the same material as the data lines (D1 to Dm). The conductive wires include source electrodes 184 and 187, drain electrodes 185 and 188, and a second capacitor electrode 189. The conductive wires can further include a data line Dm (shown in FIG. 2) and a common power line 183 (shown in FIG. 3).

Also, the conductive wires 184, 185, 187, 188, and 189 can be made to include at least one of various metallic materials known to a skilled person in a life manner of the gate electrodes 153 and 156.

The source electrodes 184 and 187 and the drain electrodes 185 and 188 contact the source regions 1334 and 1367 and the drain regions 1335 and 1368 of the semiconductor layers 133 and 136 through contact holes formed in the inorganic insulation layer 160 and the first insulation layer 170.

Further, the second capacitor electrode 189 is formed on the same position as the source electrodes 184 and 187 and the drain electrodes 185 and 188, and the exemplary embodiment is not limited thereto. Therefore, the second capacitor electrode 189 can be formed on the same layer as the gate electrodes 153 and 156.

A second insulation layer 190 is formed on the conductive wires 184, 185, 187, 188, and 189. That is, the second insulation layer 190 is provided on the data lines (D1 to Dm). The second insulation layer 190 includes a pixel opening 195 for partially revealing the first electrode 710. The second insulation layer 190 can be formed with various organic materials known to a skilled person. For example, the second insulation layer 190 is patterned to be a photosensitive organic layer, and is formed after being cured by heat or light.

An organic emission layer 720 is formed on the first electrode 710, and the second electrode 730 is formed on the organic emission layer 720. The first electrode 710, the organic emission layer 720, and the second electrode 730 form an organic light emitting element 70. The pixel opening 195 of the second insulation layer 190 on which the first electrode 710, the organic emission layer 720, and the second electrode 730 are sequentially stacked becomes a light emitting region of the organic light emitting element 70.

Figure 5:
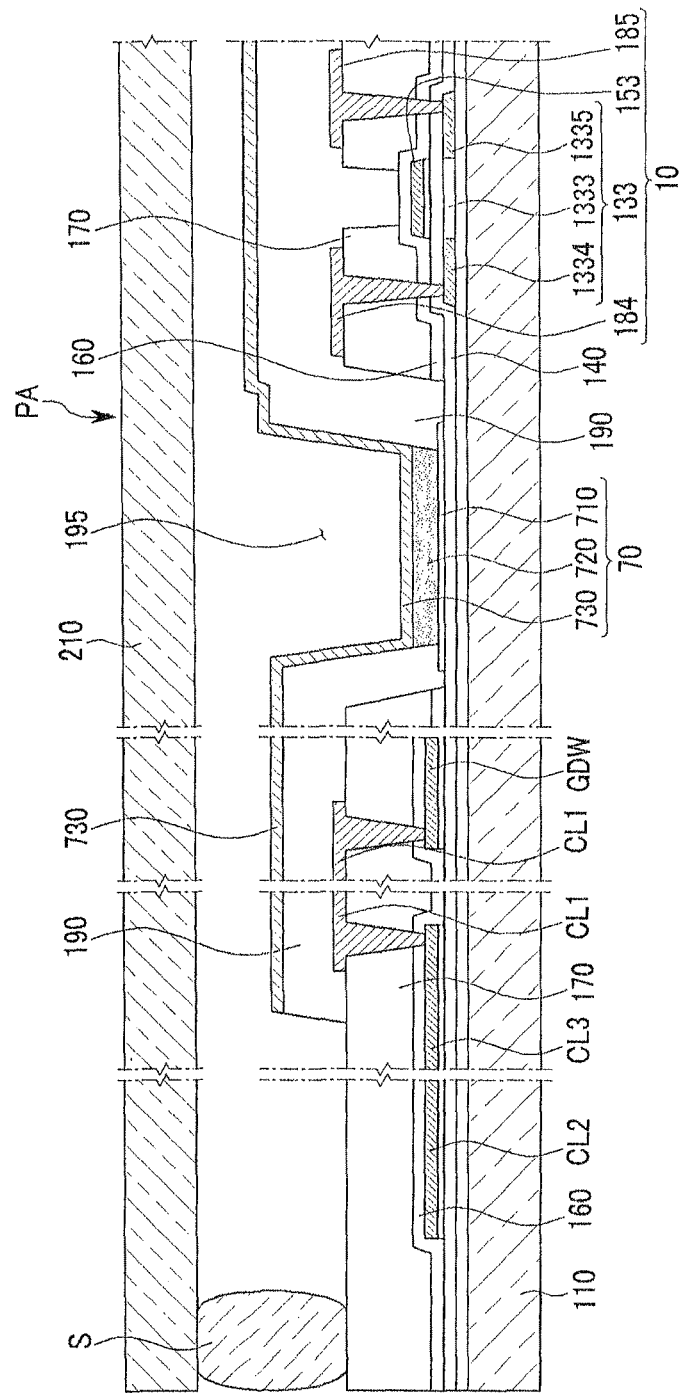
FIG. 5 shows a partially magnified cross-sectional view with respect to a first connecting line, a second connecting line, and a third connecting line shown in FIG. 2.

Referring to FIG. 5, a stacked state of the first connecting line CL1, the second connecting line CL2, and the third connecting line CL3 will now be described in detail.

FIG. 5 shows a partially magnified cross-sectional view with respect to a first connecting line, a second connecting line, and a third connecting line shown in FIG. 2.

The first connecting line CL1 is formed on the first substrate 110 on the same layer and with the material as the source electrode 184 and the drain electrode 185. That is, the first connecting line CL1 is formed on the same layer and with the same material as the data lines (D1 to Dm). The first connecting line CL1 is connected to a gate driver wire (GDW) for configuring a gate driver (GD) and a third connecting line CL3 through a contact hole formed on the first insulation layer 170. The first connecting line CL1 is overlapped on the second electrode 730, a cathode.

The second connecting line CL2 is formed on the first substrate 110 on the same layer and with the same material as the gate electrode 153. That is, the second connecting line CL2 is formed on the same layer and with the same material as the gate lines (S1 to Sn). The second connecting line CL2 is separated from the second electrode 730 in the outer direction of the panel (PA), and is not overlapped on the second electrode 730. The first insulation layer 170 is provided corresponding to the second connecting line CL2, and the second insulation layer 190 is not provided. That is, the second insulation layer 190 is not provided on the second connecting line CL2. The reason that the second insulation layer 190 is not provided on the second connecting line CL2 is that the second insulation layer 190 is formed with an organic material, and when the second insulation layer 190 is provided on the second connecting line CL2, the sealing between the second insulation layer 190 and a sealant (S) for bonding and sealing the first substrate 110 and the second substrate 210 is imperfectly performed, and moisture may enter the organic light emitting element 70 from the outside through the second insulation layer 190 provided below the sealant (S).

The third connecting line CL3 is formed on the same layer and with the same material as the gate electrode 153. That is, the third connecting line CL3 is formed on the same layer and with the same material as the second connecting line CL2, signifying that the third connecting line CL3 is formed on the same layer and with the same material as the gate lines (S1 to Sn).

The third connecting line CL3 is integrally formed with the second connecting line CL2, is extended from the second connecting line CL2, and is connected to the first connecting line CL1 through the contact hole formed in the first insulation layer 170.

As described, in the organic light emitting diode (OLED) display, the first connecting line CL1 formed on the first substrate 110 and supplying an external clock signal to the gate driver (GD) is overlapped on the second electrode 730, which is a cathode, and the second connecting line CL2 formed on the first substrate 110 and supplying the clock signal to the first connecting line CL1 through the third connecting line CL3 is not overlapped on the second electrode 730, so the delay of the clock signal on the first connecting line CL1 for receiving the clock signal from a plurality of nodes through the second connecting line CL2 is minimized.

Also, in the organic light emitting diode (OLED) display, the wire for minimizing the delay of the clock signal on the first connecting line CL1 is formed on the first substrate 110 so no flexible printed circuit (FPC) for additionally providing the clock signal to the first connecting line CL1 is needed, which works to reduce the production cost of the organic light emitting diode (OLED) display and improve the production yield.

Further, in the organic light emitting diode (OLED) display, the second connecting line CL2 is formed to be a wire provided on a different layer from the first connecting line CL1 so the second connecting line CL2 is not revealed on the first substrate 110. Therefore, an undesired short-circuited state of the second connecting line CL2 and the first connecting line CL1 is prevented and oxidization of the second connecting line CL2 during the manufacturing process is simultaneously prevented.

Also, regarding the organic light emitting diode display, gate wires including the second connecting line CL2, the third connecting line CL3, and the gate lines (S1 to Sn) are integrally formed and data wires including the first connecting line CL1 and the data lines (D1 to Dm) are integrally formed so there is no need to perform an additional process so as to form the first connecting line CL1, the second connecting line CL2, and the third connecting line CL3, which minimizes the delay of the clock signal of the organic light emitting diode (OLED) display, reduces the production cost of the organic light emitting diode (OLED) display, and improves the production yield.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode display comprising:
    a panel comprising:
        a first electrode disposed on a first substrate;
        an organic emission layer disposed on the first electrode; and
        a second electrode disposed on the organic emission layer;
    a data driver connected to a data line formed in the panel;
    a gate driver connected to a gate line formed in the panel;
    an input line for receiving a clock signal from an outside element;
    a first connecting line directly electrically connected to the input line to supply the clock signal to the gate driver, the first connecting line overlapping with the second electrode;
    a second connecting line directly electrically connected to the input line, the second connecting line overlapping with none of the first and second electrodes; and
    a third connecting line electrically connecting the second connecting line to the first connecting line.

2. The organic light emitting diode display of claim 1, wherein the gate line is formed with a gate transparent layer and a gate metal layer formed on the gate transparent layer, and the first electrode is formed on the same layer and with the same material as the gate transparent layer.

3. The organic light emitting diode display of claim 1, wherein the first connecting line is formed on the same layer and with the same material as the data line.

4. The organic light emitting diode display of claim 1, wherein the second connecting line is formed on the same layer and with the same material as the gate line.

5. The organic light emitting diode display of claim 4, wherein the third connecting line is formed on the same layer and with the same material as the second connecting line.

6. The organic light emitting diode display of claim 1, wherein the data line crosses the gate line, the panel further comprising:
    a first insulation layer provided between the gate line and the data line; and
    a second insulation layer provided on the data line and including an organic material, the second connecting line not overlapping with the second insulation layer.

* * * * *